(12) United States Patent
Ueji et al.

(10) Patent No.: US 8,475,007 B2
(45) Date of Patent: Jul. 2, 2013

(54) LIGHT EMITTING DEVICE

(75) Inventors: Yoshinori Ueji, Shinagawa-ku (JP);
Shusaku Kon, Shinagawa-ku (JP)

(73) Assignee: NEC Lighting, Ltd, Tokyo (JP)

( * ) Notice: Subject to any disclaimer, the term of this patent is extended or adjusted under 35 U.S.C. 154(b) by 399 days.

(21) Appl. No.: 12/437,025

(22) Filed: May 7, 2009

(65) Prior Publication Data

US 2009/0303728 A1    Dec. 10, 2009

(30) Foreign Application Priority Data

Jun. 9, 2008    (JP) ................................. 2008-150417

(51) Int. Cl.
*F21V 7/00*    (2006.01)
*F21S 4/00*    (2006.01)

(52) U.S. Cl.
USPC ............ 362/296.01; 362/249.01; 362/249.02; 257/98; 257/99; 257/100

(58) Field of Classification Search
USPC .................. 362/296.01, 362, 249.01–249.02; 257/98–100
See application file for complete search history.

(56) References Cited

U.S. PATENT DOCUMENTS

2006/0034084 A1*    2/2006  Matsuura et al. ............. 362/293

FOREIGN PATENT DOCUMENTS

| JP | 2004152808 A | 5/2004 |
|---|---|---|
| JP | 2004-327632 A | 11/2004 |
| JP | 2005-243740 A | 9/2005 |
| JP | 2005-277227 A | 10/2005 |
| JP | 2006-066531 A | 3/2006 |
| JP | 2006269079 A | 10/2006 |
| JP | 2007-250979 A | 9/2007 |
| JP | 2007-281260 A | 10/2007 |
| WO | WO 2005091386 A1 * | 9/2005 |

OTHER PUBLICATIONS

Communication dated Aug. 14, 2012 from the Japanese Patent Office in counterpart Japanese application No. 2008-150417.

* cited by examiner

*Primary Examiner* — Sean Gramling
(74) *Attorney, Agent, or Firm* — Sughrue Mion, PLLC

(57) ABSTRACT

A light emitting device comprises a light emitting element disposed within a space surrounded by a reflective surface of a reflector disposed on a board. A lower portion of the reflector is placed within a recess formed in the board, and a side wall of the recess is interposed between the lower end of the reflective surface of the reflector and the light emitting element.

5 Claims, 5 Drawing Sheets

LIGHT EMITTING DEVICE

This application is based upon and claims the benefit of priority from Japanese patent application No. 2008-150417, filed on Jun. 9, 2008, the disclosure of which is incorporated herein in its entirety by reference.

BACKGROUND OF THE INVENTION

1. Field of the Invention

The present invention relates to a light emitting device.

2. Description of the Related Art

In recent years, a large number of light emitting devices have been developed, that use of a light emitting element such as a light emitting diode (hereinafter sometimes called the "LED") as a light source. Some of these light emitting devices are provided with a reflector around a LED to improve the utilization efficiency of light emitted from the LED. JP-2004-327632-A discloses a light emitting device which includes a light emitting element mounted on a mount portion defined at the center of the top surface of a package. The package comprises a base having the mount portion, and a frame. A lower end of an inner peripheral surface of the frame is bonded to a side surface of the base over its entirety. An overhang is formed around a portion of the inner surface of the frame above which protrudes beyond the base. The overhang projects toward the mount portion, and the bottom surface of the overhang is not in contact with the base. Then, JP-2004-327632-A describes that the inner peripheral surface of the overhang is inclined such that the diameter of the opening becomes larger toward the top of the package, and the arithmetical average roughness of the inner peripheral surface is reduced to 0.01 [μm] or less, whereby light emitted horizontally from the light emitting element can be reflected upward on the inner peripheral surface and can be efficiently radiated from the package to the outside.

More specifically, JP-2004-327632-A describers a light emitting device which comprises a reflector arranged on a base, and a LED placed inside the reflector. In a light emitting device having such a basic structure, an interstice is formed for a variety of reasons between the bottom of the reflector and the surface on which the bottom is carried. For example, JP-2004-327632-A describes that an interstice is intentionally formed between the surface of a base and the bottom of a reflector (frame) in order to avoid a crack from occurring in a joint of the surface of the base with the bottom of the reflector due to a stress which is generated due to the difference in coefficient of thermal expansion between the base and reflector (frame). Also, an interstice can be unintentionally formed between the bottom of the reflector and a surface on which the bottom is carried. For example, when a base has a surface which presents a low flatness, or when a base warps for some reason, an interstice is formed between the surface of the base and the bottom of the reflector. Also, an insulating layer, a wiring layer and the like may be disposed on the surface of a base, and a reflector may be disposed on these layers. In this event, when the insulating layer and/or wiring layer are uneven, an interstice is formed between the insulating layer and wiring layer and the reflector.

Anyway, if an interstice exists between the bottom of the reflector and the surface on which the bottom is carried, part of light emitted from the light emitting element will be introduced into the interstice, resulting in a lower light utilization efficiency.

JP-2004-327632-A describes that the light emitted horizontally from the light emitting element can be prevented from being introduced into the interstice between the base and frame by the protrusion formed on the lower surface of the overhang. JP-2004-327632-A also describes that the light prevented from being introduced into the interstice between the base and frame by the protrusion is efficiently reflected on the inner peripheral surface of the overhang.

SUMMARY OF THE INVENTION

It is an object of the present invention to prevent light emitted from a light emitting element from being introduced into an interstice between the bottom of a reflector and a surface on which the bottom is carried in order to improve a light utilization efficiency, using a structure completely different from the structure described in JP-2004-327632-A.

In one aspect of a light emitting device according to the present invention, the light emitting device comprises a light emitting element disposed within a space surrounded by the reflective surface of a reflector disposed on a board, wherein a lower portion of the reflector is placed within a recess formed in the board, and a side wall of the recess is interposed between the lower end of the reflective surface of the reflector and the light emitting element.

In another aspect of a light emitting device according to the present invention, the light emitting device comprises a light emitting element disposed within a space surrounded by the reflective surface of a reflector disposed on a board, wherein the bottom of the reflector is adhered on the surface of the board with a resin which is capable of reflecting light emitted by the light emitting element.

The above and other objects, features and advantage of the present invention will become apparent from the following description with reference to the accompanying drawings which illustrate examples of the present invention.

DESCRIPTION OF THE EXEMPLARY EMBODIMENTS

The Exemplary Embodiment 1

Figure 1:
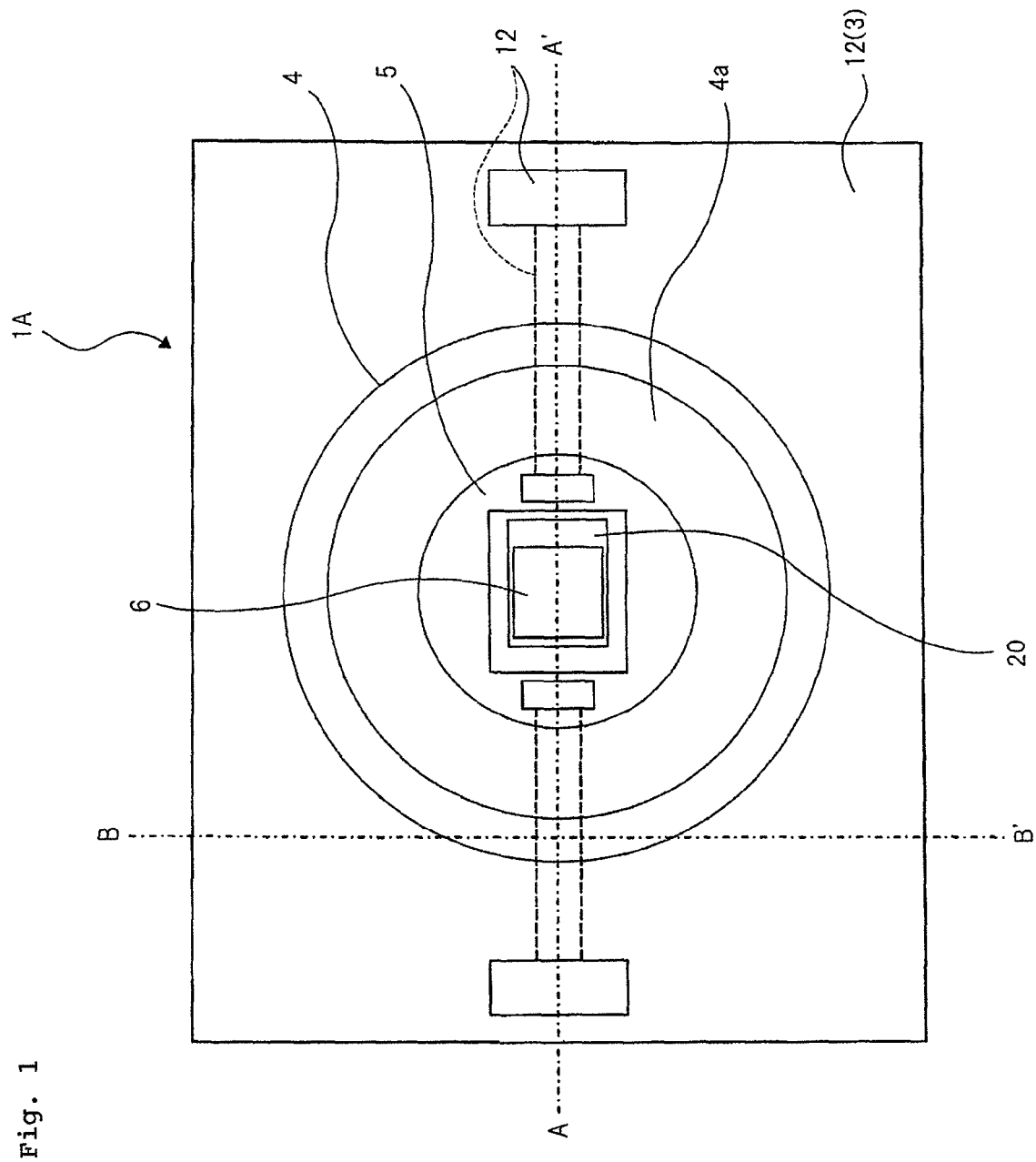
FIG. 1 is a top plan view of a light emitting device according to THE EXEMPLARY EMBODIMENT 1.
Figure 2:
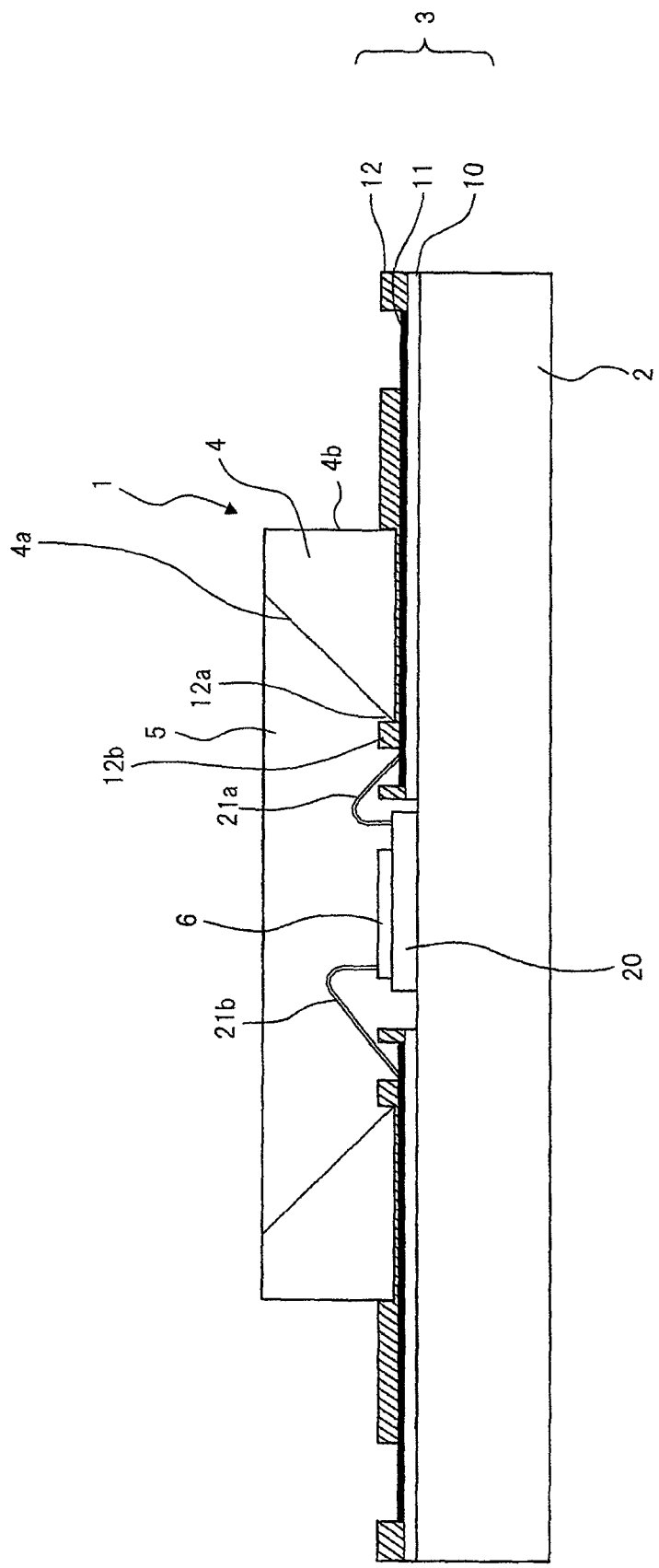
FIG. 2 is an enlarged cross-sectional view taken along line A-A' of the light emitting device shown in FIG. 1.
Figure 3:
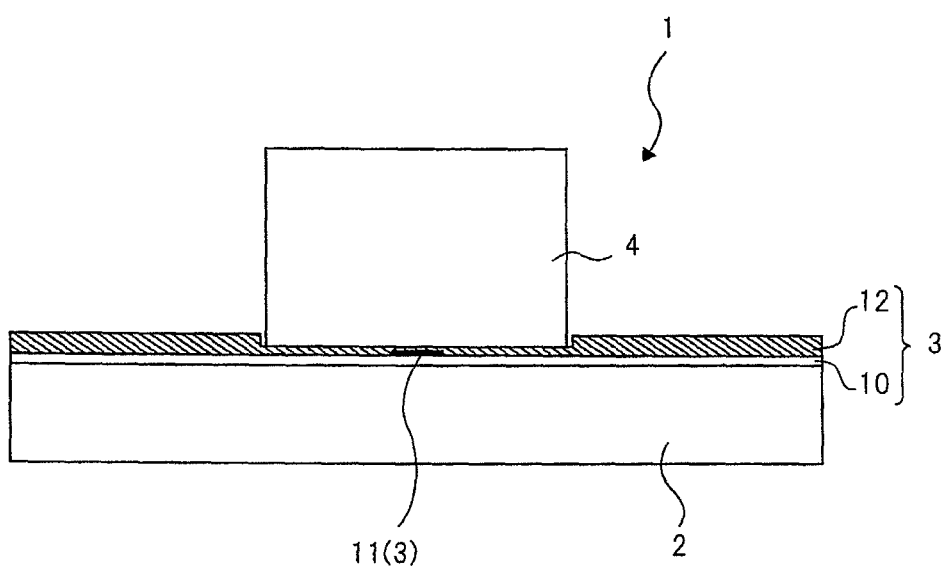
FIG. 3 is an enlarged cross-sectional view taken along line B-B' of the light emitting device shown in FIG. 1.

An exemplary embodiment of a light emitting device according to the present invention will be described in detail with reference to the drawings. FIG. 1 is a top plan view of light emitting device 1A. FIG. 2 is an enlarged cross-sectional view taken along line A-A' of light emitting device 1A shown in FIG. 1, and FIG. 3 is an enlarged cross-sectional view taken along line B-B' of light emitting device 1A shown in FIG. 1.

Light emitting device 1A is provided with annular reflector 4 on wiring board 3 laminated on the surface of base board 2. Further, LED 6 is disposed within space 5 inside of reflector 4. LED 6 is encapsulated with a transparent resin, not shown, filled in space 5. Then, part of light emitted from LED 6 transmits the transparent resin, and directly exits to the outside, while another part is reflected by inner peripheral surface (reflective surface) 4a of reflector 4 to exit to the outside.

Alternatively, instead of filling space 5 with the resin, space 5 may be vacuum sealed or sealed with nitrogen filled therein to protect LED 6. In the following, the foregoing components will be specifically described one by one.

Base board 2 is one of the basic members which make up light emitting device 1A, and also which serves as a heat radiating member for radiating heat generated from LED 6 to the outside. When taking into consideration the heat radiating properties of such basic members, base board 2 is preferably made of a metal material which exhibits high thermal conductivity, and aluminum (Al) or copper (Cu), alloys thereof, and the like, for example, are suitable.

Wiring board 3 is a laminate that is approximately 0.3 mm thick, which comprises insulating layer 10, wiring layer 11 formed on an insulating layer 10, and protective layer 12 formed on wiring layer 11. Insulating layer 10 is formed of a glass epoxy resin which comprises glass fiber dispersed in an epoxy resin. Wiring layer 11 is a wiring pattern drawn on insulating layer. The wiring pattern is drawn with an electrically conductive material (copper (Cu) in this exemplary embodiment). Protective layer 12 is formed of a heat resistant resin. Protective layer 12 is etched in a predetermined pattern such that underlying wiring layer 11 is partially exposed. Wiring board 3 that has the laminate structure is manufactured separately from base board 2, and is adhered to the surface of base board 2 with an adhesive. Alternatively, however, each of the layers which make up wiring board 3 may be formed one by one on the surface of base board 2. Anyway, wiring board 3 is formed with a throughhole extending through substantially the center thereof, so that part of the surface of base board 2 on which wiring board 3 is adhered is exposed in the throughhole. In the following description, the area of the surface of base board 2 exposed from the throughhole of wiring board 3 is called the "mount area" to distinguish it from the remaining area.

LED 6 is mounted on the mount area through sub-mount 20. Sub-mount 20 is an insulating layer made of a resin material similar to a resin material used to form insulating layer 10 of wiring board 3. A wiring pattern (not shown) is formed on the surface of sub-mount 20, and a lower electrode (not shown) of LED 6 is electrically connected to the wiring pattern. Further, the wiring pattern on sub-mount 20 connected to the lower electrode of LED 6 is connected to wiring layer 11 (wiring pattern) of wiring board 3 through a bonding wire (copper line 21a). An upper electrode (not shown) of LED 6 in turn is connected to wiring layer 11 (wiring pattern) of wiring board 3 through a bonding wire (copper line 21b).

Reflector 4 is made of aluminum (Al) or copper (Cu), alloys thereof, or the like. As described above, reflector 4 is formed in an annular shape so as to surround the mount area. Further, inner peripheral surface (reflective surface) 4a of reflector 4 comprises a tapered surface which inclines such that it becomes closer to outer peripheral surface 4b as it moves further away the surface of base board 2. Stated another way, space 5 in which LED 6 is disposed has the shape of a bowl which diverts (upward) as it moves further away from the surface of base board 2. In this regard, reflector 4 is not limited to the metal-made reflector but may be made of resin. However, when reflector 4 is made of a material which exhibits a low light reflectivity, the light reflectivity must be increased by coating at least inner peripheral surface 4a with a white paint.

Further, reflector 4 is placed inside of recess 12a formed in the protective layer of wiring board 3. Specifically, as most clearly shown in FIG. 2, an annular recess 12a is formed in protective layer 12 so as to surround the mount area, and a lower portion of reflector 4 is placed within this recess 12a. As a result, side wall 12b of recess 12a is interposed around the entirety of reflector inner peripheral surface 4a between the lower portion of reflector 4 and LED 6. Recess 12a is formed by etching or mechanically grinding protective layer 12, and the bottom of recess 12a lies at a position lower than the top surface of LED 6. Specifically, recess 12a shown in FIG. 2 has a depth of approximately 0.1 mm. Stated another way, side wall 12b of recess 12a has a height of approximately 0.1 mm.

Figure 4:
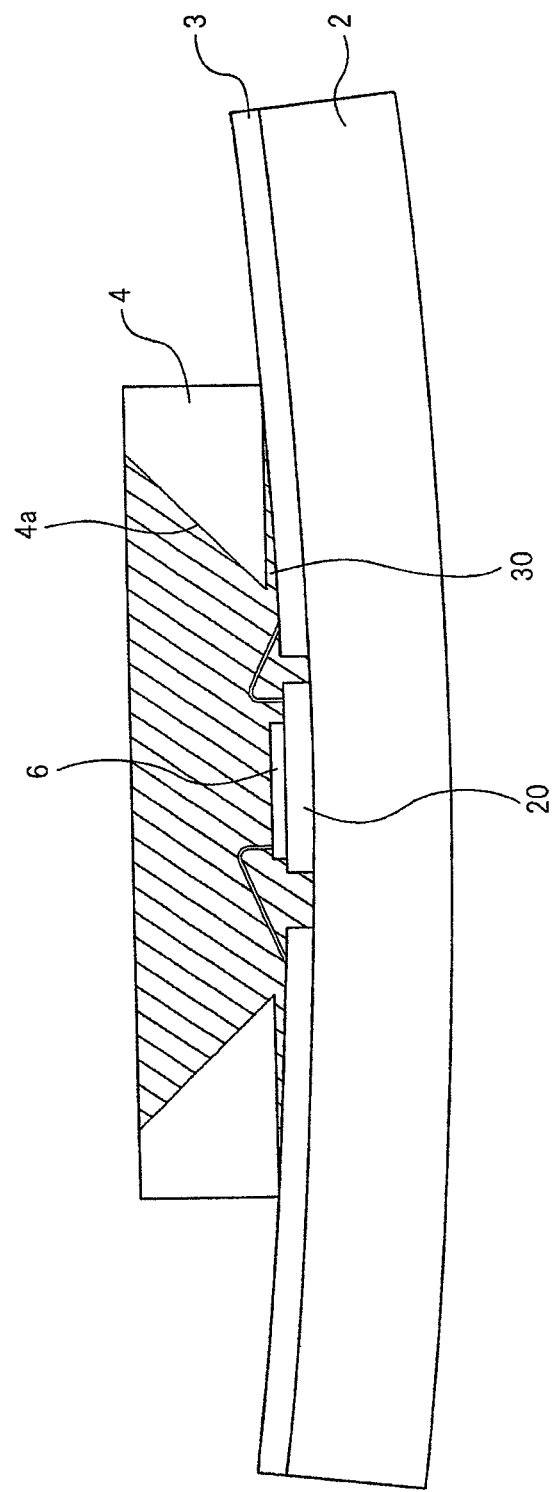
FIG. 4 is a enlarged cross-sectional view showing a light emitting device which warps upward.

By placing the lower portion of reflector 4 within recess 12a formed in wiring board 3 as described above, light emitted from LED 6 can be effectively prevented from being introduced into an interstice between the bottom of reflector 4 and a surface on which the bottom is carried (the bottom of recess 12a in this exemplary embodiment). Specifically, an interstice is formed between the bottom of reflector 4 and the bottom of recess 12a due to base board 2 or wiring board 3 being laminated thereon which is inherently warped or which is warped after manufacturing. Particularly, base board 2 and wiring board 3 laminated thereon tend to becoming warped or are warped, as shown in FIG. 4. More specifically, they are susceptible to becoming warped or are warped in a direction in which the mount area falls. In this event, it is apparent from FIG. 4 that interstice 30 is larger at a site closer to the lower end of reflector inner peripheral surface 4a. However, if the height of interstice 30 is lower than side wall 12b of recess 12a shown in FIG. 2, light emitted from LED 6 is reflected on the surface of side wall 12b, and cannot be introduced into interstice 30.

Also, an interstice can be formed between the bottom of reflector 4 and the bottom of recess 12a if the bottom of recess 12a inherently has asperities or is rugged after the manufacture. However, in this event, light emitted from LED 6 is likewise reflected on the surface of side wall 12b without being introduced into the interstice if the height of interstice 30 is lower than the depth of recess 12a.

Then, the light reflected on the surface of side wall 12b transmits the transparent resin and exits to the outside, or is reflected by reflector inner peripheral surface 4a and exits to the outside. It should be noted that for convenience, FIG. 4 shows reflector 4 disposed on wiring board 3 which is not formed with recess 12a.

In essence, one aspect of the present invention is characterized by forming a light shield between reflector 4 and LED 6 for preventing light emitted from LED 6 from being introduced into the interstice between the bottom of reflector 4 and the surface on which the bottom is carried, by fitting the lower portion of reflector 4 into a groove formed around LED 6.

Additionally, a fluorescent material may be dispersed within the transparent resin to emit light at a wavelength different from that of the light emitted from LED 6. More specifically, the transparent resin may include a fluorescent material dispersed therein which is excited by the light emitted from LED 6 to emit light at a wavelength that is longer or shorter than that of the light emitted from LED 6. Alternatively, similar effects can be produced by covering the transparent resin with a resin sheet or a glass sheet which is dispersed the fluorescent material or by embedding the resin sheet or glass sheet into the transparent resin.

The Exemplary Embodiment 2

In the following, another exemplary embodiment of a light emitting device according to the present invention will be described with reference to FIG. 5. Components common to light emitting device 1A according to EXEMPLARY EMBODIMENT 1 are designated the same reference numerals in FIG. 5, and descriptions thereon are omitted.

Figure 5:
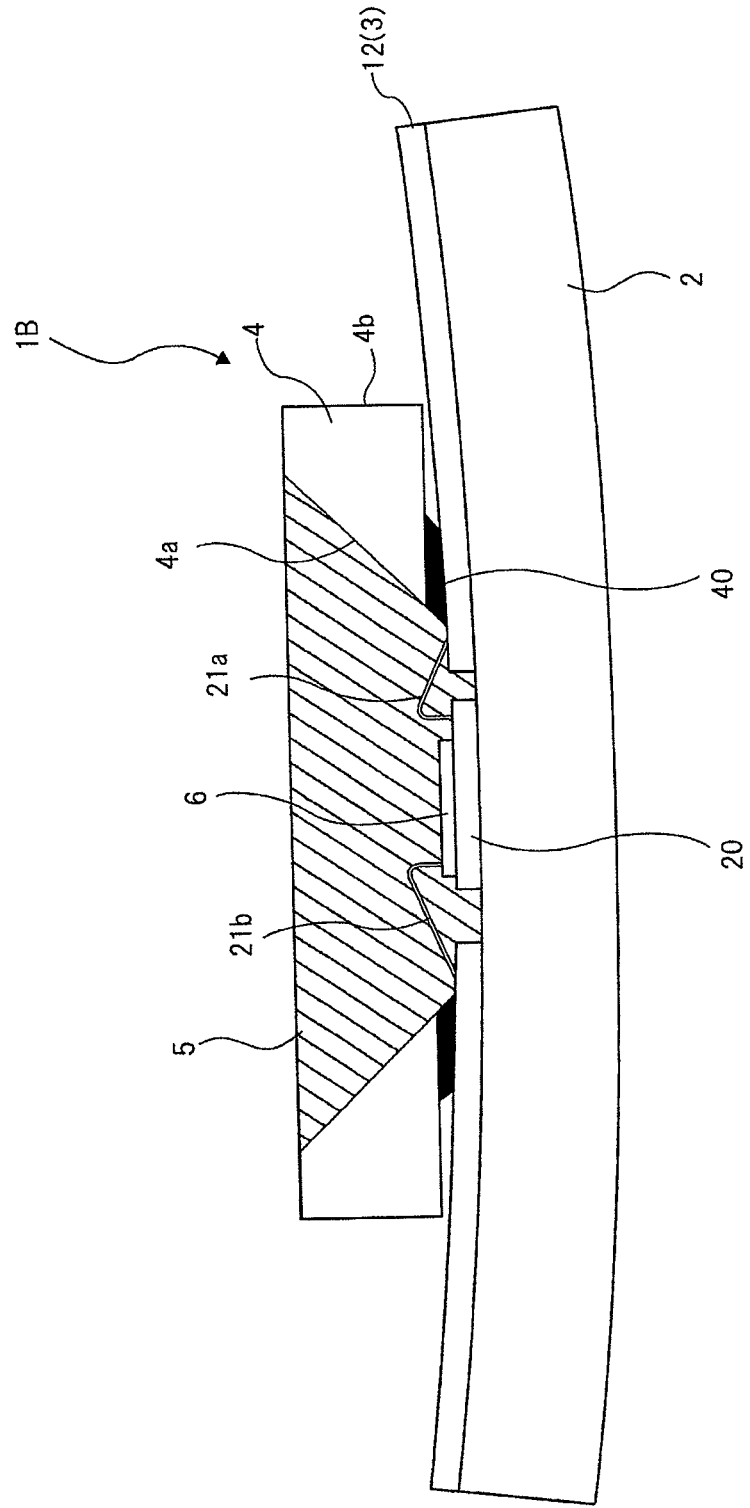
FIG. 5 is a top plan view of a light emitting device according to THE EXEMPLARY EMBODIMENT 2.

In light emitting device 1B shown in FIG. 5, wiring board 4 (protective layer 12) is not formed with recess 12a shown in FIG. 2, so that the surface of protective layer 12 is flat. Thus, reflector 4 is fixed on the surface of protective layer 12 with adhesive 40 which has high light reflectivity. More specifically, a partial area of the bottom of reflector 4, which is in contact with the lower end of inner peripheral surface 4a, is fixed on the surface of protective layer 12 with adhesive 40. As a result, adhesive 40 reflects light which is to be introduced into an interstice between the bottom of reflector 4 and a surface on which the bottom is carried (surface of protective layer 12 in this exemplary embodiment), so that the light will not be introduced into the interstice. Then, the light reflected by adhesive 40 transmits the transparent resin within space 5 and exits to the outside, or is reflected by reflector inner peripheral surface 4a and exits to the outside. It should be noted that while FIG. 5 depicts protective layer 12 alone, wiring board 3 has the laminate structure shown in FIG. 2.

While adhesive 40 is not particularly limited as long as it can efficiently reflect light emitted from LED 6, materials suitable for adhesive 40 include a white silicon-based resin, a white acrylic-based resin, an epoxy-based resin containing a reflective material (for example, silver filler), and the like. Also, when a resin containing a reflective material is used for adhesive 40, a larger amount of reflective material is better from the viewpoint of increasing reflectivity, where the amount of reflective material contained therein is preferably 95 or more percent by weight, by way of example.

It should be readily understood from the foregoing description that the entire area of the bottom of reflector 4 does not have to be fixed on the surface of protective layer 12 with adhesive 40 in order to achieve the object of preventing light from being introduced into the interstice between the bottom of reflector 4 and the surface of protective layer 12. Specifically, the foregoing object is achieved if adhesive 40 interposes between the partial area in contact with the lower end of inner peripheral surface 4a of reflector 4 and the surface of protective layer 12. Of course, the entire area of the bottom of reflector 4 may be fixed on the surface of protective layer 12 with adhesive 40 in order to increase the adhesive strength. Also, the remaining area other than the partial area in contact with the lower end of inner peripheral surface 4a may be fixed on the surface of protective layer with another adhesive.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A light emitting device comprising:
   a board including at least an insulating layer, a wiring layer disposed on said insulating layer, and a protective layer disposed on said wiring layer, said protective layer being formed with a recess;
   a reflector disposed on said board; and
   a light emitting element disposed within a space surrounded by a reflective surface of said reflector,
   wherein a lower portion of said reflector is placed within the recess, and a side wall of the recess is interposed between a lower end of the reflective surface of said reflector and said light emitting element, and the lower end of the reflective surface is located below an upper surface of said light emitting element; and
   wherein a lower surface of said light emitting element is located below an upper end of said side wall of said recess.

2. The light emitting device according to claim 1, wherein said board has a thickness of 0.3 μm, and said recess has a depth of 0.1 μm.

3. The light emitting device according to claim 1, wherein said board is laid on a base board made of a metal.

4. The light emitting device according to claim 1, wherein said light emitting element is encapsulated with a resin filled in said space, and said resin contains a material excited by light emitted by said light emitting element to emit light at a wavelength different from that of the light emitted from said light emitting element.

5. The light emitting device according to claim 1, further comprising a sheet including a material which is excited by light emitted by said light emitting element to emit light at a wavelength different from that of the light emitted by said light emitting element, said sheet being disposed inside or outside of said space, or disposed both inside and outside of said space.

* * * * *